United States Patent
Sato

(10) Patent No.: US 6,922,650 B2
(45) Date of Patent: Jul. 26, 2005

(54) SEMICONDUCTOR DEVICE TESTER AND ITS METHOD

(75) Inventor: Hiroshi Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 91 days.

(21) Appl. No.: 10/466,002

(22) PCT Filed: Jan. 11, 2002

(86) PCT No.: PCT/JP02/00122

§ 371 (c)(1),
(2), (4) Date: Jul. 8, 2003

(87) PCT Pub. No.: WO02/056043

PCT Pub. Date: Jul. 18, 2002

(65) Prior Publication Data

US 2004/0056662 A1 Mar. 25, 2004

(30) Foreign Application Priority Data

Jan. 12, 2001 (JP) .................................. 2001-005210

(51) Int. Cl.⁷ ........................... G01R 31/28; G06F 19/00
(52) U.S. Cl. ...................... 702/120; 702/125; 714/744; 324/763
(58) Field of Search ............................... 702/120, 117, 702/118, 124, 125; 714/724, 735, 736, 738, 744; 324/763, 765

(56) References Cited

U.S. PATENT DOCUMENTS

| | | | | |
|---|---|---|---|---|
| 5,796,748 A | * | 8/1998 | Housako et al. | 714/720 |
| 5,854,796 A | * | 12/1998 | Sato | 714/718 |
| 5,982,682 A | * | 11/1999 | Nevill et al. | 365/201 |
| 6,055,209 A | * | 4/2000 | Abo | 365/233 |
| 6,108,793 A | * | 8/2000 | Fujii et al. | 713/400 |
| 6,374,378 B1 | * | 4/2002 | Takano et al. | 714/719 |
| 6,391,667 B1 | * | 5/2002 | Hashimoto | 438/17 |
| 6,502,216 B1 | * | 12/2002 | Takano | 714/738 |
| 6,591,385 B1 | * | 7/2003 | Krech et al. | 714/718 |

FOREIGN PATENT DOCUMENTS

DE 19900974 9/1999
JP 200151021 2/2001

* cited by examiner

*Primary Examiner*—Patrick Assouad
(74) *Attorney, Agent, or Firm*—David N. Lathrop, Esq.; Gallagher & Lathrop

(57) ABSTRACT

Data on a period longer than the test cycle period concerned in a high-speed pattern test is preset in a period data storage 41, then a flag 1 is set in a cycle stretch setting part 16E of a pattern-generation memory 16 at an address position where to execute cycle stretch, then a high-speed pattern test signal is applied, and when the flag 1 is read out by an address from an address counter 14, a switching part 42 is controlled to switch data read out of a test cycle memory 34 to data set in a setting register 44 for application to a test cycle generator 36, thereby lengthening the test cycle period.

13 Claims, 9 Drawing Sheets

FIG.2
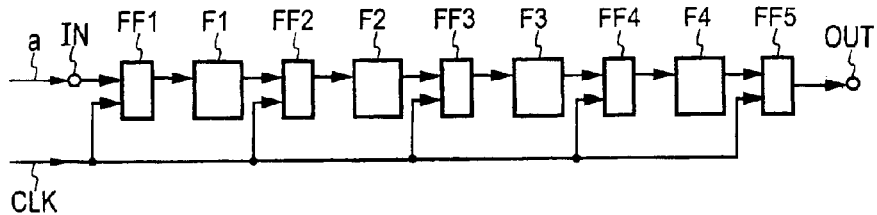
FIG.3
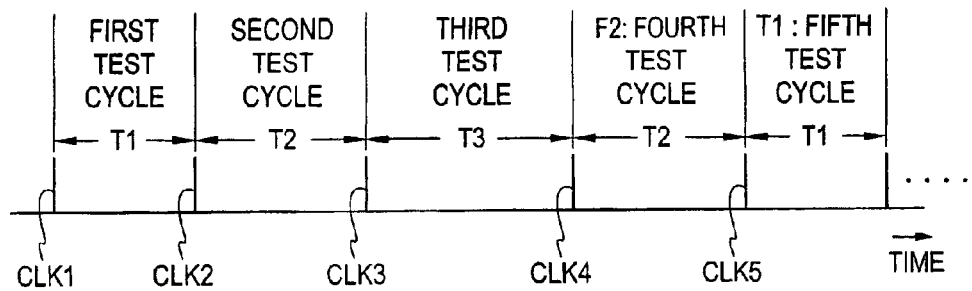
FIG.4
| | PERIOD DATA | F1 OUTPUT (INPUT TO FF2) | F2 OUTPUT (INPUT TO FF3) | F3 OUTPUT (INPUT TO FF4) | F4 OUTPUT (INPUT TO FF5) | OUT |
|---|---|---|---|---|---|---|
| 1 | T1 | a | | | | |
| 2 | T2 | | a | | | |
| 3 | T3 | | | a(x) | | |
| 4 | T2 | | | | a(x) | |
| 5 | T1 | | | | | a(x) FL |
TEST CYCLE

| TEST CYCLE | PERIOD DATA | F1 OUTPUT | F2 OUTPUT | F3 OUTPUT | F4 OUTPUT | OUT |
|---|---|---|---|---|---|---|
| 1 | T4 | a | | | | |
| 2 | T2 | | a | | | |
| 3 | T3 | | | a(x) | | |
| 4 | T2 | | | | a(x) | |
| 5 | T1 | | | | | a(x) FL |

| TEST CYCLE | PERIOD DATA | F1 OUTPUT | F2 OUTPUT | F3 OUTPUT | F4 OUTPUT | OUT |
|---|---|---|---|---|---|---|
| 1 | T4 | a | | | | |
| 2 | T2 | | a | | | |
| 3 | T3 | | | a(○) | | |
| 4 | T2 | | | | a(○) | |
| 5 | T1 | | | | | a(○) PA |

| TEST CYCLE | PERIOD DATA | F1 OUTPUT | F2 OUTPUT | F3 OUTPUT | F4 OUTPUT | OUT |
|---|---|---|---|---|---|---|
| 1 | T4 | a | | | | |
| 2 | T2 | | a | | | |
| 3 | T3 | | | a(x) | | |
| 4 | T2 | | | | a(x) | |
| 5 | T1 | | | | | a(○) FL |

FIG.10

| TEST CYCLE | 1 | 2 | 3 | 4 | 5 | 6 | 7 | ... |
|---|---|---|---|---|---|---|---|---|
| ADDRESS | A1 | A2 | A3 | A4 | A3 | A4 | A5 | ... |

SEMICONDUCTOR DEVICE TESTER AND ITS METHOD

TECHNICAL FIELD

The present invention relates to a semiconductor integrated circuit or similar semiconductor device test equipment and method and, more particularly, to semiconductor device test equipment and method capable of locating a failed functional block of a semiconductor device by what is called a cycle stretch test scheme which sequentially stretches the test periods of a sequence of test patterns.

BACKGROUND ART

FIG. 1 shows the general outline of conventional semiconductor device test equipment together with the internal functional configuration of a pattern generator 10 in particular. The pattern generator 10 is provided with a switch 12, an address counter 14, a pattern-generation memory 16 and a control part 18. In the pattern-generation memory 16 there are provided a test pattern storage part 16A, a control pattern storage part 16B, an operand storage part 16C and a command storage part 16D; a test pattern 24A, a control pattern 24B, an operand 22 and an op code (a Japanese abridged equivalent of operation code) 20 are stored in these storage parts 16A, 16B, 16C and 16D, respectively. The operation code 20 is a sequence control instruction (a Japanese transliteration of "instruction") such as a branch instruction, and the operand 22 is auxiliary data (such as a jump-to address) necessary for execution of a sequence following the operation code 20. The test pattern 24A contains a test pattern signal which is prepared to make a check to see if a device under test DUT is failing, and an expected value pattern signal which is expected as a normal device response to the input of the test pattern signal.

A description will be given of operations of respective parts for generating the test pattern 24A and the control pattern 24B in the conventional pattern generator 10. To begin with, a start address 26 is preset in the address counter 14 via the switch 12 from the outside. The pattern-generation memory 16 is accessed by the start address 26 to read out the command 20, the operand 22, the test pattern 24A and the control pattern 24B stored in the pattern-generation memory 16. The read-out test pattern 24A is converted by a waveform shaper 27 into a test pattern signal having a real waveform, which is applied via a driver DR to the device under test DUT. The expected value pattern contained in the test pattern 24A is fed to a logic comparator 28. The output signal from the device under test DUT in response to the test pattern signal applied thereto is compared by a comparator CP with a high-level and a low-level voltage, and the comparator output is provided to the logic comparator 28.

The control pattern 24B is supplied to a timing memory 30 and a test cycle memory 34. The timing memory 30 follows a timing pattern in he control pattern 24B to output timing data which defines rise and fall timing of the test pattern signal to be applied to the device under test DUT and the timing for comparing the response output signal from the device under test DUT with the expected value pattern, that is, what is called strobe timing; the timing data is input to a timing generator 32, and timing clocks of various timing are applied to the waveform shaper 27 and the logic comparator 28. Incidentally, in some cases the strobe timing pulse is applied to the comparator CP and at that timing the compared output is provided from the comparator CP.

The test cycle memory 34 follows test cycle data in the control pattern 24B to output period (time) data indicating the time length Ti of each test cycle and send the period data to a test cycle generator 36, causing the test cycle generator 36 to generate a period signal of the time length Ti of each test cycle. The period signal thus generated is applied to the timing generator 32, which generates, within the duration of the test cycle period signal Ti, various timing clocks corresponding to the above-mentioned timing data input thereto. The period Ti is used as the operation period of the pattern generator 10 and is also provided to the control part 18; the control part 18 effects address control for the generation of the next test pattern or the like.

While in FIG. 1 there is shown the configuration for only one pin of the device under test DUT, a similar configuration is used as well for each pin to perform application of the test pattern signal and comparison between the response output signal and the expected value pattern.

Recently there is a demand for speedups of semiconductor devices. To meet this demand, it is necessary, in testing semiconductor devices, too, to apply a high-speed test pattern signal to the device under test DUT. Accordingly, the tendency at present is toward setting short the period (time) Ti of the test cycle.

In the case where the semiconductor device under test DUT has such a circuit configuration as depicted in FIG. FIG. 2 in which functional blocks F1, F2, F3 and F4 are connected in cascade via flip-flops FF2, FF3 and FF4, respectively, if any one of the functional block is failing, the test pattern signal input via an input terminal IN is provided via the flip-flop FF1 to the functional block directly connected thereto; the output from each functional block is provided to the next functional block. Since the test pattern signal input via the input terminal IN is distorted by the failing functional block before it is provided as the output from the functional block F4 to an output terminal OUT via a flip-flop FF5, the response output signal from the output terminal OUT does not agree with the expected value pattern, and consequently the device under test is decided as failing (a failure).

There is a variety of possible causes for the failure of the device under test DUT; for instance, when one of functional blocks does not meet the timing specification set forth in the design of the device, data cannot correctly be transferred from that functional block to the next one—this may sometimes lead to a failure. To locate the functional block in which such a failure has occurred, it is customary to adopt a test scheme referred to as cycle stretch.

With the cycle stretch scheme, a sequence of test pattern signals is applied to a cascade-connected circuit of a functional block whose output was found failing in preliminary testing with a high-speed test pattern signal; in this instance, the period of only one of test cycles of test pattern signals is cycle-stretched to be longer than the test cycle period in ordinary high-speed testing and a check is made to see if the output from the cascade-connected circuit of the failing functional block is still failing, followed by testing while cycle-stretching the test cycles one after another, for example, in the order of first test cycle—second test cycle—third test cycle . . . , and when the output from the cascade-connected circuit of the failing functional block changes from fail to pass (good), it is decided that the functional block of the stage following the first-stage functional block by the number of cycle stretches iterated until then does not satisfy the timing specifications.

Referring now to FIGS. 2 to 7, the general outline of the cycle stretch test scheme will be described in brief. The description will be given of the case where the functional block F2 second from the input terminal IN in the cascade connection of the functional blocks shown in FIG. 2 is incapable of high-speed operation and malfunctions in the high-speed pattern signal test (an ordinary test).

Let it be assumed that in first, second, . . . test cycles, clocks CLK1, CLK2, CLK3, CLK4, . . . of defined periods are applied to all the flip-flops FF1, FF2, . . . , FF5 in the order of period data T1-T2-T3-T2 and that pieces of data processed in the respective functional blocks are sequentially transferred from the functional block F1 to F2, from F2 to F3 and from F3 to F4 for each of the clocks CLK1, CLK2, CLK3, CLK4, . . . .

FIG. 4 shows the input/output state of the respective functional blocks in the case where the test cycles are conducted in the order of the periods T1-T2-T3-T2- . . . , that is, in the case where the blocks were tested using an ordinary high-speed test pattern signal. Letting T1, T2 and T3 represent the periods defined by the period data, respectively, and assuming, for example, that T1<T2<T3, the transfer of data a from the flip-flop FF1 to FF2 takes place in the period of the period data T1, the transfer of data a from the flip-flop FF2 to FF3 takes place in the period of the period data T2, the transfer of data a from the flip-flop FF3 to FF4 takes places in the period of the period data T3, and the transfer of data from the flip-flop FF4 to an output terminal OUT takes place in the period of the period data T2. In the test using these pieces of high-speed period data T1, T2 and T3, assuming that the functional block F2 malfunctions, the processed data a(x) to be transferred to the functional blocks F3 and F4 is already distorted in the functional block F2, and consequently, the processed data a(x) that is output to the output terminal OUT in the fifth test cycle is judged failed FL.

To avoid this, the cycle stretch test scheme is adopted; in the first place, as shown in FIG. 5, only the first test cycle is cycle-stretched to provide period data T4 which defines a cycle period longer than that by any of the pieces of high-speed period data T1, T2 and T3 (T1<T2<T3<T4). In the first test cycle, data a is input to the flip-flop FF1, then the input is processed in the functional block F1, and at the beginning of the second test cycle the output from the functional block F1 is provided to the flip-flop FF2 and transferred therefrom to the functional block F2. Since the functional block F1 is a normal block, the processed data a is normally processed and transferred to the function block F2 of the second stage; however, since the period length of the second test cycle is T2 which is one of pieces of high-speed period data, the functional block F2 cannot normally process the input data within the period of the second test cycle, and at the beginning of the third test cycle bad data a(x) distorted from a normal processed value is input to the flip-flop FF3. Thereafter the bad data a(x) is output to the output terminal OUT via the functional blocks F3 and F4, and hence the data thus provided to the output terminal OUT is judged failed FL in the fifth test cycle.

Next, as depicted in FIG. 6, only the second test cycle is cycle-stretched, by which in the second test cycle the processing period in each functional block is extended to T4. In this case, since the period of the second test cycle is sufficiently long, the functional block F2 processes the input data thereto normally, and at the beginning of the third test cycle the normally processed data a(O) is provided to the flip-clop FF3, from which it is input to the functional block F3. As a result, the normally processed data a(O) is transferred to the functional blocks F3 and F4 one after the other and output to the output terminal OUT, and in the fifth test cycle the test result becomes a pass PA.

As described above, the test cycles are cycle-stretched in a sequentially order starting from the first test cycle, and since the number of times the cycle stretch has been performed until the decision result on the output at the output terminal OUT changes from failed FL to good (pass) PA is 2, it can be decided that the functional block F2 second from the first-stage one F1 does not fulfill the timing specifications.

FIG. 7 shows the case where the cycle stretch is performed in the third test cycle and the processing time in each functional block is set to T4. In this instance, since the malfunctioning functional block F2 is allowed to process data a in the second test cycle for only the period of the period data T2 which is one of the pieces of high-speed period data, the data input as the output from the functional block F2 to the flip-flop F3 at the beginning of the third test cycle become failed data a(x), and this failed data a(x) is output from the functional block F4 to the output terminal OUT, with the result that the decision result in the fifth test cycle becomes failed FL.

It will be easily understood that when the period data T4 is similarly set for the fourth test cycle (cycle-stretched), the output at the output terminal OUT in the fifth test cycle is decided failed FL. Accordingly, as opposed to the above, the cycle stretch may also start from the test cycle immediately preceding the test cycle in which the output decision result was decided as failed and proceed toward the first test cycle on a cycle-by-cycle basis such that, in the above case, the fourth test cycle immediately preceding the fifth one in which the output decision result was decided as failed FL is cycle-stretched first, followed by the third test cycle; in this instance, when the output decision result changes from failed FL to good (pass) after N cycle-stretch iterations, that is, when the functional block F2 Nth from the last in FIG. 2 is failing, the output decision result changes from failed to pass PA after three cycle-stretch iterations, making it possible to decide that the functional block F2 third from the last does not meet the timing specifications. Usually the test pattern to be applied to the device under test DUT is composed of many test cycles and hence is long, and for each test cycle a check is made to see if the device output is failed or not. Accordingly, when the device output is decided as failed, for example, in an M-th test cycle, the test is conducted while stretching the preceding test cycles one after another, that is, in the order of M−1, M−2, . . . , by which the time for deciding the failing functional block can be reduced.

As is evident from the above, by repeating the test while sequentially stretching (a Japanese equivalent of the word) the time for data transfer between the cascade-connected functional blocks F1, F2, F3 and F4, it is possible to detect a functional block which operates normally only when the cycle period is stretched, and the detected information can be used as a material for semiconductor device developments.

To conduct the above-described cycle stretch scheme, in the prior art the period data for cycle stretch, T4 in the above example, is stored in the test cycle memory 34 in the pattern generator 10 in FIG. 1, then the test cycle data in the control pattern 24B of the test pattern stored in the memory 16 at the address corresponding to the first test cycle is rewritten to the cycle stretch period data T4, after which the test is conducted; that is, the test is carried out after cycle-stretching the first test cycle, then the test cycle data rewritten for the first test cycle is restored to the original test cycle data and, at the same time, the test cycle data in the control pattern 24B at the address corresponding to the second test cycle is rewritten to the period data T4, and the test is carried out, and thereafter, similarly in the subsequent test cycles the rewritten test cycle data for the previous test cycle is restored to the original and the test cycle data in the control pattern 24B corresponding to the next test cycle is rewritten to the cycle stretch data therefor, and the test is carried out until the test result changes from failed FL to good PA.

The rewriting of the test cycle data and its restoration to the original test cycle data for each test cycle involve rewriting the pattern program to the original data and translating the pattern program for the rewriting and the restoration to the original data into machine language readable by the test equipment, and since this carried out for each test cycle, much time is taken for the data rewriting and data restoration. Furthermore, the data restoration requires saving of the original data, for example, T2.

Moreover, in the prior art, as data indicating whether to execute cycle stretch or not, period data, which is not used in the high-speed pattern test signal, is written in the pattern-generation memory 16 at the address concerned, but in the case where period data is already written in the test cycle data memory 34 at every address, it is not clear from the contents of the memory 34 as to whether there is period data usable for the cycle stretch concerned, and if any, which data is usable.

Incidentally, since in the test using an ordinary high-speed test pattern signal no check is made as to which data was used as the test cycle data, the control pattern storage part 16B of the pattern-generation memory 16 is read out to check which test cycle data to be used in the high-speed test pattern signal was used; that is, in the above example it is checked that the test cycle data used is T1, T2 and T3, and use is made of the period data T4 not used. Looking for such unused period data consumes much labor and time when the number of test cycles of the high-speed pattern signal is large.

For example, since the period data that can be stored in the test cycle memory 34 is limited to four pieces of data T1, T2, T3 and T4, if the number of piece of period data necessary for test is "4" and the number of pieces of period data that can be stored is "42," the prior data to be used for cycle stretch, for example, T5, cannot be stored in the test cycle memory 34 and no cycle stretch test can be carried out.

An object of the present invention is to propose a semiconductor device test method and semiconductor device test equipment which permit easy execution of cycle stretch in a required test cycle and sequential stretch of test cycles without causing an appreciable increase in the amount of time for test, and enable cycle stretch to be performed even if no period data for cycle stretch can be stored in the test cycle memory because it is already full.

DISCLOSURE OF THE INVENTION

According to the present invention: period data for stretch is stored in a period data storage; the number of times the pattern to be applied to a device under test is generated or the address in a pattern-generation memory, which corresponds to the test cycle to be cycle-stretched, is set in a stretch cycle detecting part; when the number of times the pattern is applied to the device under test or the address for reading out the pattern-generation memory coincides with the data set in the stretch cycle detecting part as the test proceeds, a detected signal is output from the stretch cycle detecting part; by the detected signal, the period data for stretch set in the period data storage is provided to a test cycle generator in place of period data read out of a test cycle memory; and a test pattern of the test cycle is applied to the semiconductor device for that period longer than at least the test cycle of a normal high-speed test pattern signal which is determined by the period data for stretch, that is, the cycle stretch test is carried out.

In generally, the test is conducted after one address of the pattern-generation memory or the number of times the pattern is generated in a sequence of high-speed test pattern signals is set in the stretch cycle detecting part, and the number of times the pattern is generated or the address is changed so that the test cycles are cycle-stretched one by one in a sequential order until the test result changes from failed FL to good PA.

BRIEF DESCRIPTION OF THE DRAWINGS

FIG. 2 is a block diagram showing an example of a cascade-connected circuit of functional blocks in a semiconductor device.

FIG. 3 is a timing chart showing, by way of example, the period of each test cycle in a high-speed pattern rest.

FIG. 4 is a diagram showing, by way of example, the relationship between the period of each test cycle and input data to each functional block in the high-speed pattern test.

FIG. 5 is a diagram showing input data to each functional block in each cycle when a first test cycle is cycle-stretched.

FIG. 6 is a diagram corresponding to FIG. 5 when a second test cycle is cycle-stretched.

FIG. 7 is a diagram corresponding to FIG. 5 when a third test cycle is cycle-stretched.

FIG. 10 is a diagram showing, by way of example, the relationship between test cycle numbers and addresses for reading out a pattern-generation memory in the case of containing a loop in a test signal.

BEST MODE FOR CARRYING OUT THE INVENTION

Figure 1:
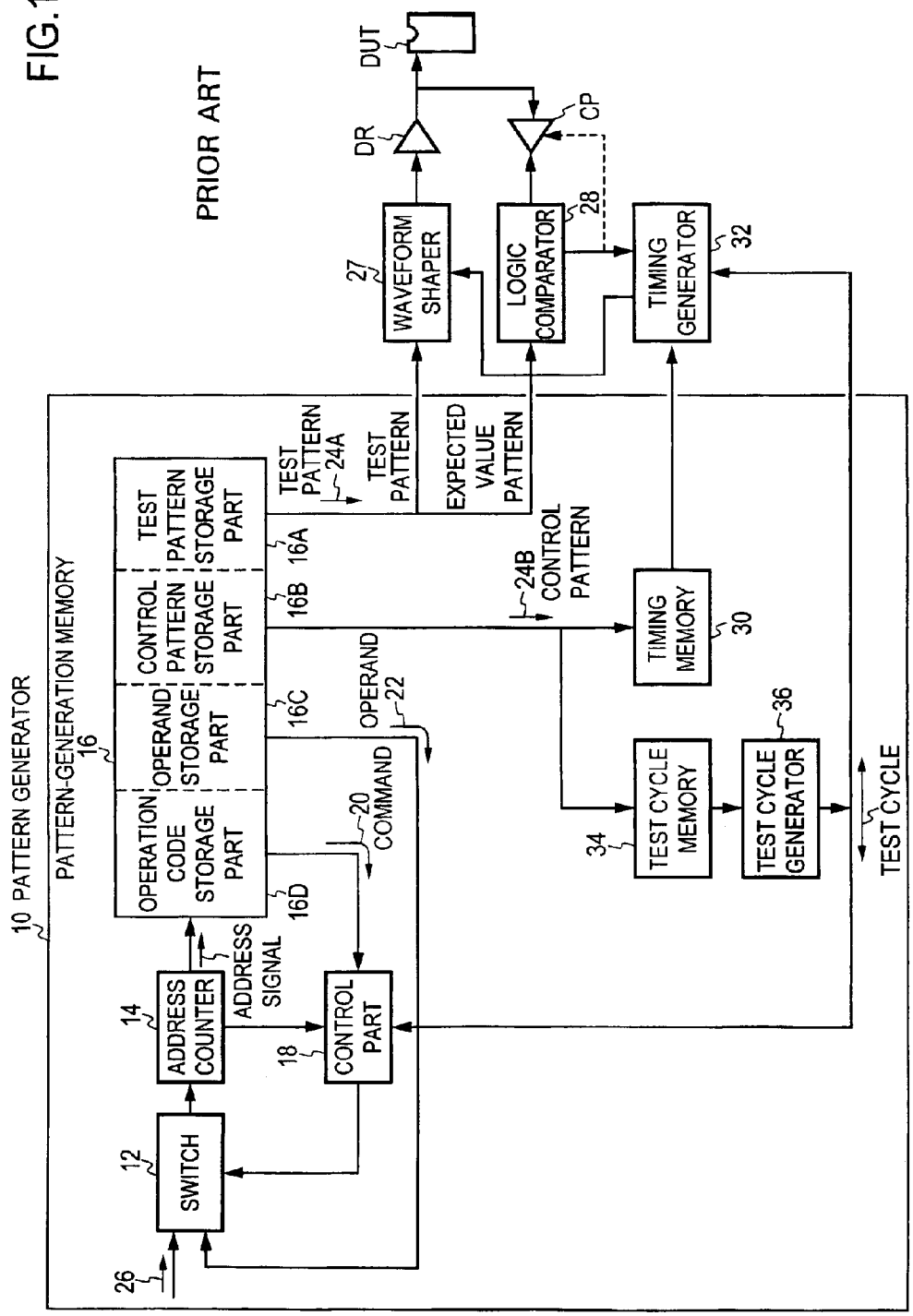
FIG. 1 is a block diagram showing an example of the functional configuration of a conventional semiconductor device test equipment.
Figure 8:
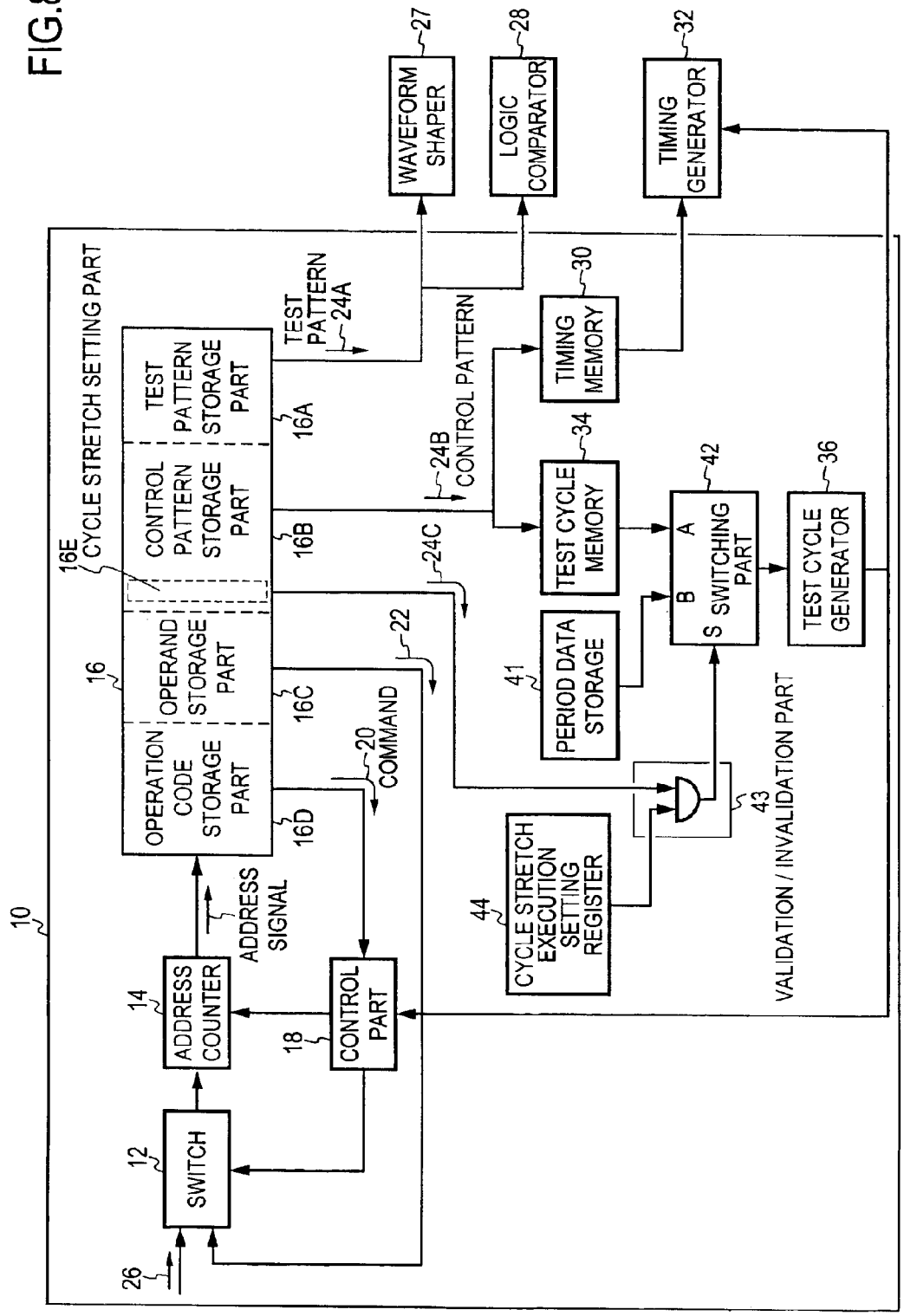
FIG. 8 is a block diagram illustrating the functional configuration of an embodiment of this invention equipment.

FIG. 8 illustrates an embodiment of the semiconductor device test equipment according to the present invention, in which the parts corresponding to those in FIG. 1 are identified by the same reference numerals. Incidentally, in the following drawings, too, such corresponding parts are denoted by the same reference numerals.

This embodiment features the provision of: a cycle stretch setting part 16E in the control pattern storage part 16B set in the pattern-generation memory 16; a period data storage 41 having stored therein period data for stretch which is used for cycle stretch; a validation/invalidation part 43 which control whether to validate or invalidate a cycle stretch execution pattern 24D read out from the cycle stretch setting part 16E; and a switching part 42 which responds to the cycle stretch execution pattern validated by the validation/invalidation part 34 to switch the state of selecting the period data prepared in the test cycle memory 34 to the state of selecting the period data. prepared in the period data storage 41.

One-bit data representing whether to execute the cycle stretch is set in the cycle stretch execution setting register 44. By setting, for example, "1" logic data in the setting register 44, the test equipment is set in the state of executing the cycle stretch. That is, upon reading out a cycle stretch execution pattern of "1" logic from the cycle stretch setting part 16E when the setting register 44 is set for execution of the cycle stretch, the validation/invalidation part 43 inputs the cycle stretch execution pattern "1" to a control input terminal S of the switching part 42, by which the output from the switching part 42 is switched from the input applied to an input terminal A to an input to the input terminal B, thus transferring to the test cycle generator 36 the period data from the period data storage 41 connected to the input terminal B.

The value of the period data for stretch stored in the period data storage 41 is used for cycle stretch and hence is chosen to provide a period at least longer than the length of the test cycle concerned in the high-speed pattern signal, for example, a period longer than the longest one of the period data prepared in the test cycle memory 34. Only by describing in the cycle stretch setting register 16E the cycle stretch execution pattern (for instance, a "1" logic pattern) for executing a cycle stretch of the test cycle concerned, that is, only by setting a flag, the test cycle can be cycle-stretched in accordance with the period data for stretch stored in the period data storage 41.

In the case of conducting the cycle stretch test, as described above, when a failure (FL) is detected, for example, in an M-th test cycle in a high-speed pattern signal test, the test equipment is set for the cycle stretch test, that is, "1" logic data is set in the cycle stretch execution setting register 44 to enter the cycle stretch test state, in which the test is carried out first with a flag "1" set in the cycle stretch setting part 16E in the pattern-generation memory 16 at the address corresponding to the (M−1)th test cycle immediately preceding the M-th test cycle, and in the next cycle the above-mentioned flag is reset and a flag is set in the cycle stretch setting part 16E at the address corresponding to the (M−2)th test cycle; in this way, the test is carried out for each test cycle desired. When the cycle stretch test is not conducted, "0" logic data is set in the cycle stretch execution setting register 44 by which even if the cycle stretch execution pattern 24C is read out, it is invalidated in the validation/invalidation part 43 and the switching part 42 supplies therethrough the period data from the test cycle memory 34 to the test cycle generator 36.

As described above, according to this embodiment, the cycle stretch setting part 16E is provided independently of the test pattern storage part 16A and the control pattern storage part 16B, and a pattern for executing cycle stretch, that is, a flag needs only to be described in the cycle stretch setting part 16E at the address corresponding to the test cycle to be cycle-stretched; therefore, the execution of cycle stretch can be set without changing the description of the control pattern for pattern generation use 24B. That is, since this can be accomplished by describing the cycle stretch execution pattern or merely the flag in the cycle stretch setting part 16E at the address corresponding to the test cycle to be cycle-stretched and erasing the flag in the cycle stretch setting part 16E at the address corresponding to the previous cycle stretch, the change of the description does not involve translation of the pattern program into machine language, and hence it can be done with ease. This allows ease in changing the cycle to be cycle-stretched, enabling the functional block of a semiconductor device incapable of high-sped response to be detected within a short time.

Furthermore, according to this embodiment, the period data for stretch use in the case of executing cycle stretch is prepared in the period data storage 41 provided separately of the test cycle memory 34, and in the case of executing cycle stretch, the period data set in the period data storage 41 is used—this permits setting the period data for stretch use to an arbitrary value. Since the cycle stretch period can freely be set, it is also possible to determine at which extent of speed the functional block incapable of high-speed response becomes inoperable by changing the value of the period data for stretch which is set in the period data storage 41. Moreover, in the prior art, in the case of writing the period data for stretch use in an empty area of the test cycle memory 34, since the corresponding timing data set is also stored in the timing memory 30, the timing data set needs to be written therein; in this embodiment, however, since timing data is read out from the timing memory 34 by the control pattern 24B at the time of cycle stretch, there is no need for writing the timing data in the timing memory 30.

Incidentally, the cycle stretch execution setting register 44 and the validation/invalidation part 43 may be omitted, in which case in the normal high-speed pattern test the cycle stretch execution pattern 24C in the cycle stretch setting part 16E is set to all "0s", whereas in the cycle stretch test the cycle stretch execution patter 24C is set to "1" at the required address of the cycle stretch setting part 16E and the output read out therefrom is provided directly to the switching part 42.

Figure 9:
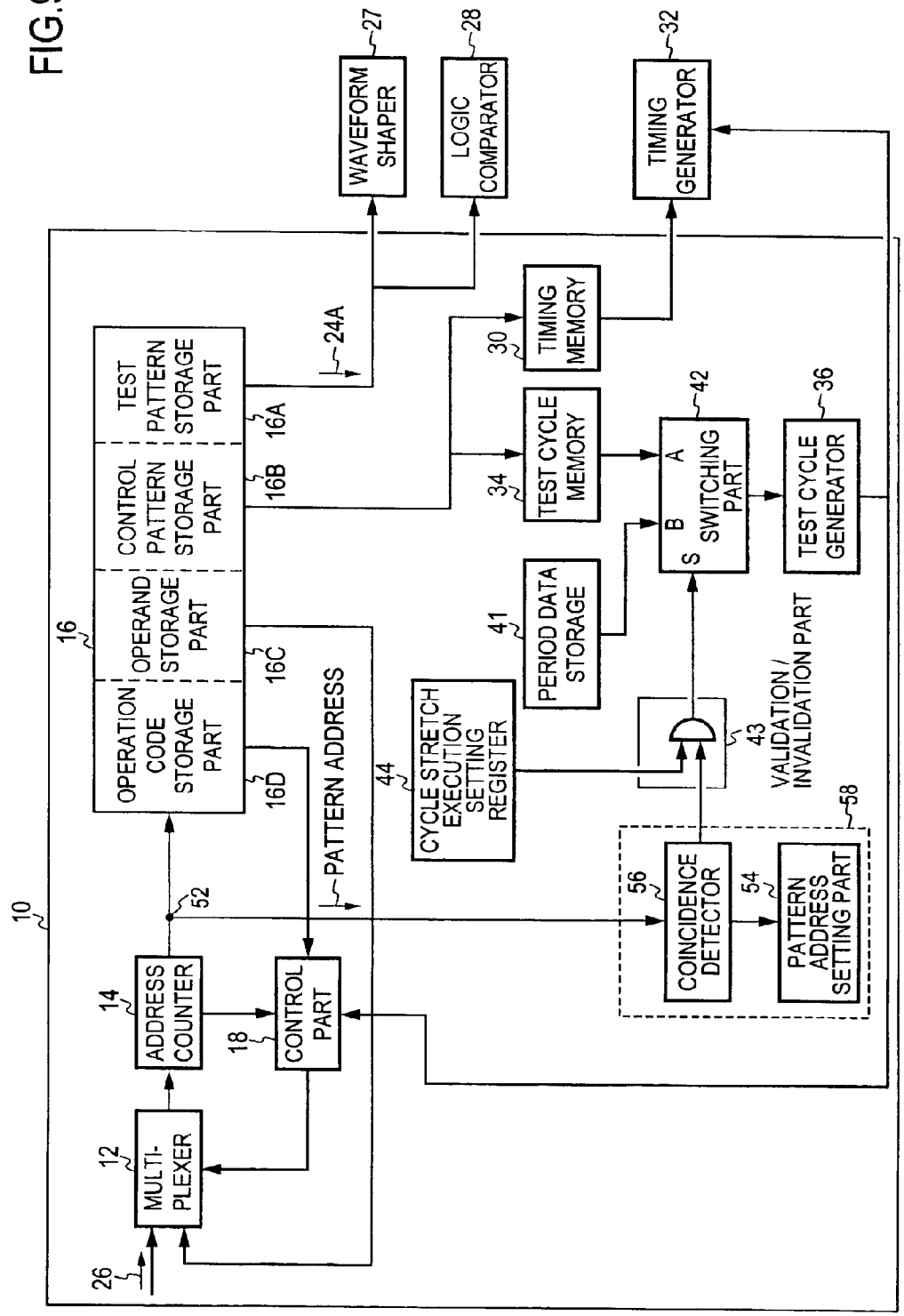
FIG. 9 is a block diagram illustrating the functional configuration of another embodiment of this invention equipment.

FIG. 9 illustrates another embodiment of the semiconductor device test equipment according to the present invention. This embodiment features a construction which includes the period data storage 41, the switching part 42, the cycle stretch execution setting register 44 and the validation/invalidation part 43 as in the embodiment of FIG. 8 and, further, includes branching means 52 for branching to a coincidence detector 56 the pattern address to be applied from the address counter 14 to the pattern-generation memory 16, a pattern address setting part 54 for setting therein the pattern address for the execution of cycle stretch and supplies it to the coincidence detector 56 and the coincidence detector 56 for detecting the coincidence between the pattern addresses input thereto. The pattern address setting part 54 may be merely a register.

In this embodiment, when the pattern address to be provided to the pattern-generation memory 16 coincides with the pattern address set in the pattern address setting part 54, the coincidence detector 56 detects this state and applies a coincidence signal to the validation/invalidation part 43. Accordingly, when there is set in the cycle stretch execution setting register 44, for example, "1" logic data representing the execution of cycle stretch, the coincidence signal from the coincidence detector 56 is applied as a selection control signal to the switching part 42, and as a result, the switching part 42 inputs the period data stored in the period data storage 41 to the test cycle generator 36, executing cycle stretch.

In the cycle stretch test, for example, when failure FL occurs in an M-th test cycle, the address output from the address counter 14 in an (M−1)th test cycle is set in the pattern address setting part 54 for testing with a sequence of test signals, then the address output from the address counter 14 in an (M−2)th test cycle is similarly set in the pattern address setting part 54, and in each of the subsequent test cycles the address output from the address counter 14 in the immediately preceding test cycle is set in the pattern address setting part 54.

This embodiment avoids the necessity for newly providing the cycle stretch setting part 16E in the pattern-generation memory 16, and enables the memory 16 intact. In this case, too, this embodiment does not necessitate translation of the pattern program into machine language upon each switching the test cycle to be cycle-stretched, hence permitting testing within a short time and producing the other effects of the FIG. 8 embodiment.

In this instance, too, it is possible to omit the cycle stretch execution setting register 44 and the validation/invalidation part 43 so that the output from the coincidence detector 56 is applied directly to the control signal input terminal S of the switching part 42 and that when no cycle stretch test is conducted, the address which is not provided in the pattern-generation memory 16 is set in the pattern address setting part 54.

A sequence of high-speed test pattern signals may sometimes contain a loop. For example, as depicted in FIG. 10, as the test cycle proceeds to first, second, third and fourth, the address counter 14 generates addresses A1, A2, A3 and A4 for the pattern-generation memory 16 in a sequential order, and in the next fifth test cycle the operation enters the loop repeating the addresses A3 and A4, which is a single loop such that addresses generated are A3, A4 and A5 in fifth, sixth and seventh test cycles, respectively. In such a case, when the flag "1" is set at the address A4 of the cycle stretch setting part 16 in the FIG. 8 embodiment or the address A4 is set in the cycle stretch setting part 48 in the FIG. 9 embodiment in order to cycle-stretch the sixth test cycle, the cycle stretch is executed in the fourth test cycle as well as in the sixth test cycle; therefore, even if the decision output becomes good PA for the first time in this test, it is impossible to decide which of the functional blocks of the stages preceding the output one is failing, on the basis of the number of cycles between the M-th test cycle in which the decision output became failed FL and the sixth or fourth test cycle.

Figure 11:
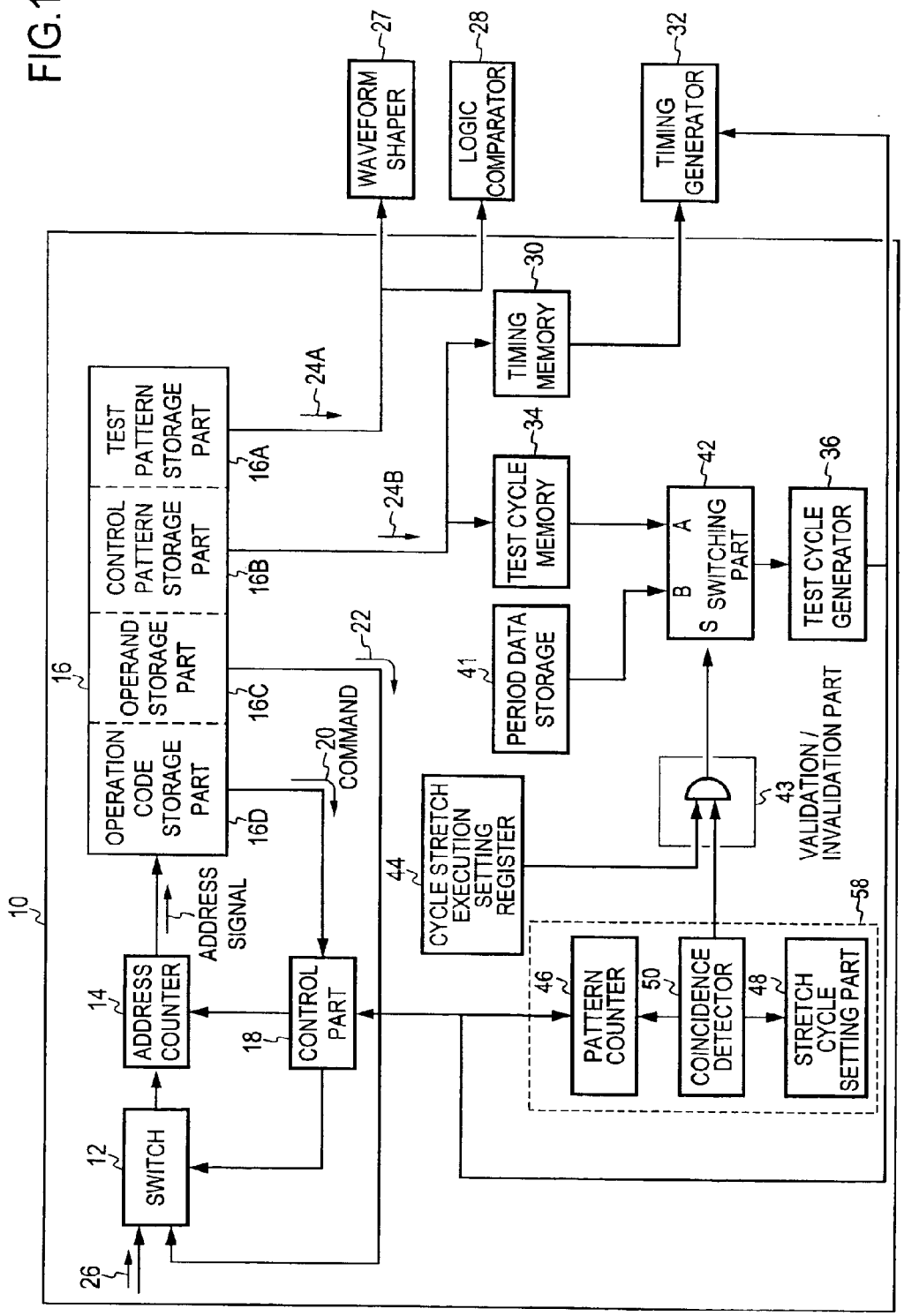
FIG. 11 is a block diagram illustrating the functional configuration of another embodiment of this invention equipment.

In FIG. 11 there is illustrated an embodiment of this invention equipment which overcomes such a problem. This embodiment also features a construction which includes, the period data storage 41, the switching part 42, the cycle stretch execution setting register 44 and the validation/invalidation part 43, and further includes: a patter counter 46 which counts the number of test patterns generated and outputs the count value to the coincidence detector 50; a stretch cycle setting part 48 which sets the number of patterns to be generated, which defines the test cycle to be cycle-stretched, that is, the number indicating how-manieth test cycle it is, and outputs the cycle number to the coincidence detector 50; and the coincidence detector 50 which detects the coincidence of the count value of the pattern counter 46 with the value set in the stretch cycle setting part 48, and outputs an coincidence-detected output to the validation/invalidation part 43.

In the case of conducting the cycle stretch test, "1" logic data is set in the cycle stretch execution setting register 44, then the number of patterns to be generated which defines the test cycle to be cycle-stretched is set in the stretch cycle setting part 48, and the test is conducted with a sequence of high-speed test pattern signals. When the number of test patterns to be generated coincides with the number of times (the value of the number of the test cycle) set in the stretch cycle setting part 48, the coincidence detector 50 outputs the coincidence signal; the coincidence signal is input via the validation/invalidation part 43 to the control signal input terminal S of the switching part 42 to switch its output from the input at the input terminal A to the input at the input terminal B, that is, the switch 42 sends therethrough to the test cycle generator 36 the period data for cycle stretch use stored in the period data storage 41. The test is repeated while sequentially changing the number of patterns to be generated which is set in the stretch cycle setting part 48 in the same manner as described above.

With the configuration of this embodiment, by setting in the stretch cycle setting part 48 the number of patterns to be generated which defines the test cycle to be cycle-stretched, the cycle stretch can be executed in the defined test cycle, and even when the sequence of test pattern signals contains a loop, failing functional blocks can be determined one by one. Since the stretch cycle setting part 48 can be formed by, for example, merely a register, setting and changing of the numerical value are easy, and no translation of the pattern program into machine language is needed each time the test cycle to be cycle-stretch is switch to be next. Accordingly, since the test cycle to be cycle-stretched can be changed freely and easily, functional blocks incapable of high-speed operation can easily be detected by cycle stretch. Furthermore, as the pattern-generation memory 16 can be used the existing memory of this kind.

In this case, too, the cycle stretch execution setting register 44 and the validation/invalidation part 43 may be omitted, in which case the output from the coincidence detector 59 is applied directly to the control signal input terminal S of the switching part 42 and when no cycle stretch test is conducted, a test cycle number absent in the test pattern signal is set in the stretch cycle setting part 48.

In the above-described embodiment, in the case of executing the cycle stretch, the timing data read out of the timing memory 39 is provided to the timing generator 32. In the case of executing the cycle stretch, the timing data may also be changed corresponding to the cycle stretch.

Figure 12:
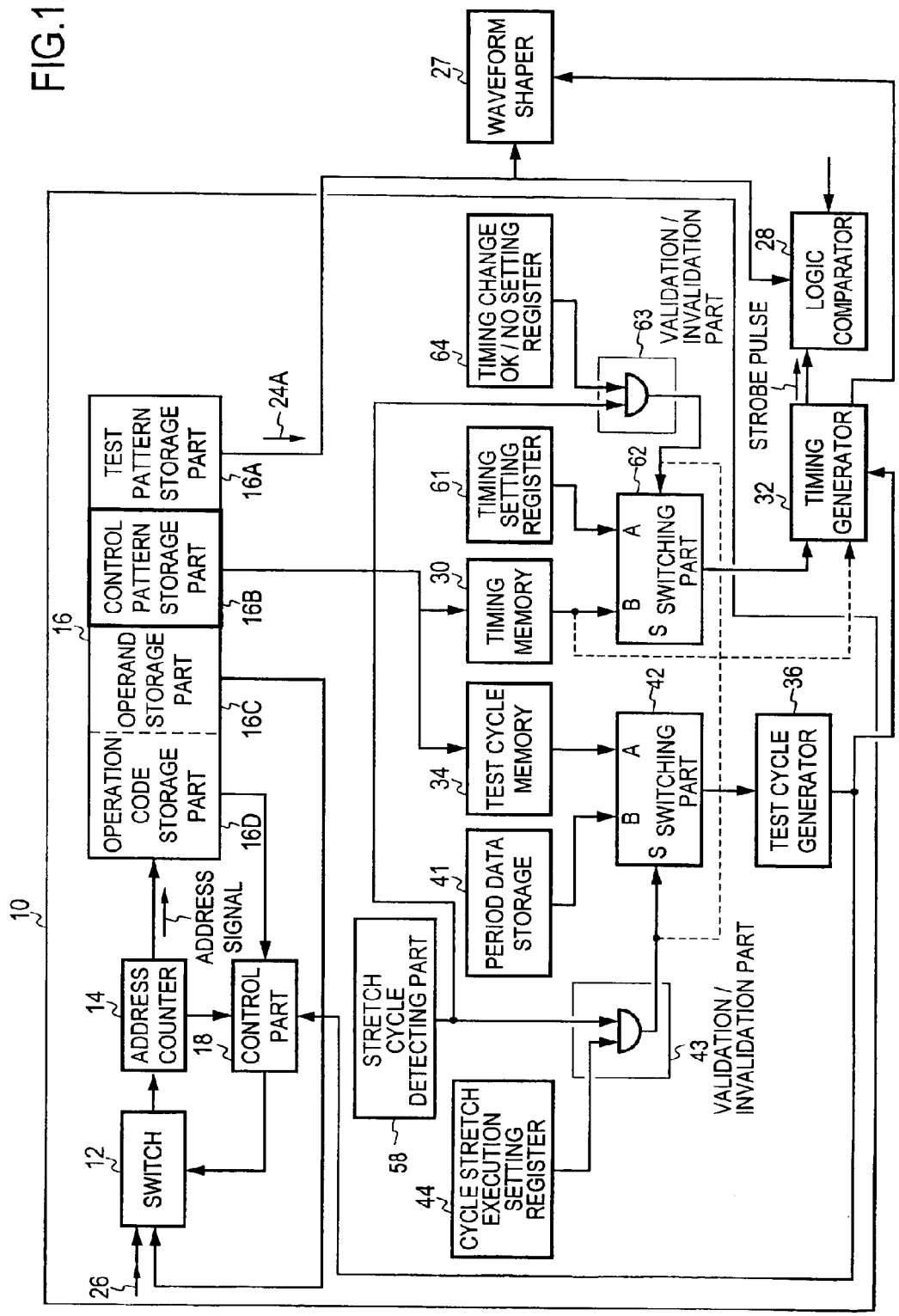
FIG. 12 is a diagram illustrating the functional configuration of still another embodiment of this invention equipment.

FIG. 12 illustrates its embodiment. In this embodiment the phase of the strobe pulse, which is applied from th timing memory 30 via the timing generator 32 to the logic comparator 28, is shifted in synchronization with the cycle stretch to shift the timing of the logic comparison, and, for example, a delay in the rise or fall of the output signal from the semiconductor device under test DUT is detected, or the input phase of the input (clock, data) to the semiconductor device under test DUT is changed, by which it is possible to detect an input timing failure or the like.

A switching part 62 is provided at the output side of the timing memory 30 so that the timing data read out from the timing memory 30 and the timing data set in a timing setting register 61 are switched by the switching part 62. When the stretch cycle detecting part 58 supplies the validation/invalidation part 63 with a detected output indicating the test cycle to be cycle-stretched and the validation/invalidation part 63 is made valid by a timing change OK state setting output from a timing change OK/NO setting register 64, a stretch cycle detected signal is input to the control signal input terminal S of the switching part 62, and the switching part 62 is switched from the read-out data from the timing memory 30 to the timing data set in the timing setting register 61 and supplies the latter to the timing generator 32.

According to this embodiment, since the timing for the logical comparison by the logic comparator 28 can be shifted to timing other than that prepared in the timing memory 30, it is possible to detect a defect which cannot be detected simply by cycle stretch, such as a detect that the output signal from the semiconductor device DUT is decided as failed because of a delay in the timing of its rise or fall, or to detect improper timing for the input to the semiconductor device. In the prior art equipment, to make such a change in timing requires changing the timing pattern in the control pattern 24B stored in the pattern-generation memory 16 at the address corresponding to the test cycle to be cycle-stretched and, in addition, restoring the changed timing to the original one afterward; that is, it is necessary to translate the pattern program into machine language, but according to this embodiment a desired timing pattern needs only to be set in the timing setting register 61.

While in FIG. 12 the timing data set in the timing setting register 61 is the pieces of timing data which define the timing for the rise or/and fall of the waveform to be input to the waveform shaper 27 and the timing for the strobe pulse to be fed to the logic comparator 28 at the time of cycle stretch, it is also possible to set only either one of the two pieces of timing data in the timing setting register and provide, as the other data, the timing data from the timing memory 30 to the timing generator 32 as indicated by the broken line in FIG. 12.

The stretch cycle detecting part 58 is made up of the cycle stretch setting part 16E and the address counter 14 for reading out its stored contents in the embodiment of FIG. 8, and when the read-out cycle stretch execution pattern 24C (flag) is "1", it becomes the stretch cycle detected output for cycle stretch. In the FIG. 9 embodiment, the pattern address setting part 54 and the coincidence detector 56 constitute the stretch cycle detecting part 58, and the output from the coincidence detector 56 becomes the output from the stretch cycle detecting part 58. In the FIG. 11 embodiment, the pattern counter 46, the stretch cycle setting part 48 and the coincidence detector 50 constitute the stretch cycle detecting part 58, and the output from the coincidence detector 50 becomes the output from the stretch cycle detecting part 58. That is, the stretch cycle detecting part 58 the stretch cycle detecting part is one that stores therein the data representing the number of the test cycle to be stretched or the address corresponding thereto and outputs the stretch cycle detected output when the generated test cycle of the test pattern reaches the test cycle indicated by the set data.

Since the stretch cycle detecting part 58 has such a configuration, it is also possible, as described previously, to omit the validation/invalidation part 43 and the cycle stretch execution setting register 44 and apply the output from the cycle stretch detecting part 58 directly to the control signal input terminal S of each of the switching parts 42 and 62. Further, in the above embodiment the timing change OK/NO setting register 64 so that the timing data set in the timing setting register 61 is utilized as required at the time of cycle stretch, but in the case of using the timing data set in the timing setting register 61 for cycle stretch without fail, it is possible to omit the validation/invalidation part 63 and provide the output from the validation/invalidation part 43 to the control signal input terminal S of the switching part 63 as indicated by the broken line in FIG. 12. Incidentally, in the above the cycle periods need not always be T1<T2<T3 but the user determines them such that T1<T3<T2, for instance.

Next, a description will be given, with reference to FIG. 13, of the procedures in embodiments of the semiconductor device testing method, that is, in the embodiments of FIGS. 8, 9, 11 and 12.

The test procedure begin with conducting the high-speed pattern test to detect the test cycle in which a failure has occurred. This followed by the cycle stretch. In the first place, in step S1 "1" logic data is set in the cycle stretch execution setting register 44 to bring about the cycle stretch executable state.

In the case where it is desirable to change the timing data as well, "1" logic is set in the register 64 in step S2 to bring about a timing change OK state. When cycle stretch is accompanied by the timing change without fail, step S2 is omitted and the switching part 62 is also controlled by the output from the validation/invalidation part 43 as indicated by the broken line in FIG. 12. Moreover, when the cycle stretch execution setting register 44 may be dispensed with as referred to previously, steps S1 and S2 are omitted.

Next, in step S3 the test cycle to be cycle-stretched is set in the stretch cycle detecting part 58. That is, for example, a number smaller by 1 than the number of times the test patterns were applied to a non-tested device during the interval from the start of the high-speed pattern test to the detection of the afore-mentioned failure is set in the stretch cycle setting part 48 in FIG. 11, or the address in the address counter 14 corresponding to the number of the test cycle in which the failure was detected is set in the pattern address setting part 54 in FIG. 9, or a flag "1" is set in the cycle stretch setting part 16E in FIG. 8 at the address corresponding to the above address.

In step S4 the period data for stretch, that is, the period data representing a period longer than the test cycle concerned in the high-speed pattern test, is set in the period data storage 41, and in the case where the timing data is also changed at the time of the cycle stretch test, the timing data for the cycle stretch is set in the timing setting register 61 in step S5.

Thereafter, in step S6 the cycle stretch test is conducted, that is, the test is done using the high-speed pattern test signal. If the test result is not pass PA (S7), then in step S8 the test cycle number (the number of times the patterns were applied) immediately preceding the currently set test cycle to be executed, or the address corresponding to the test cycle number, or the setting of the position of the flag "12 corresponding to that address, that is, the setting in the stretch cycle detecting part 58 is updated, followed by a return to step S4.

If the test result becomes pass PA in step S7, then in step S9 the number of the failure-detected test cycle and the number of the test cycle in which the test result became pass PA in step S7 are used to decide how-manieth stage from the output terminal in which the failed block was detected, and the decision is stored in a storage part in the test equipment.

Figure 13:
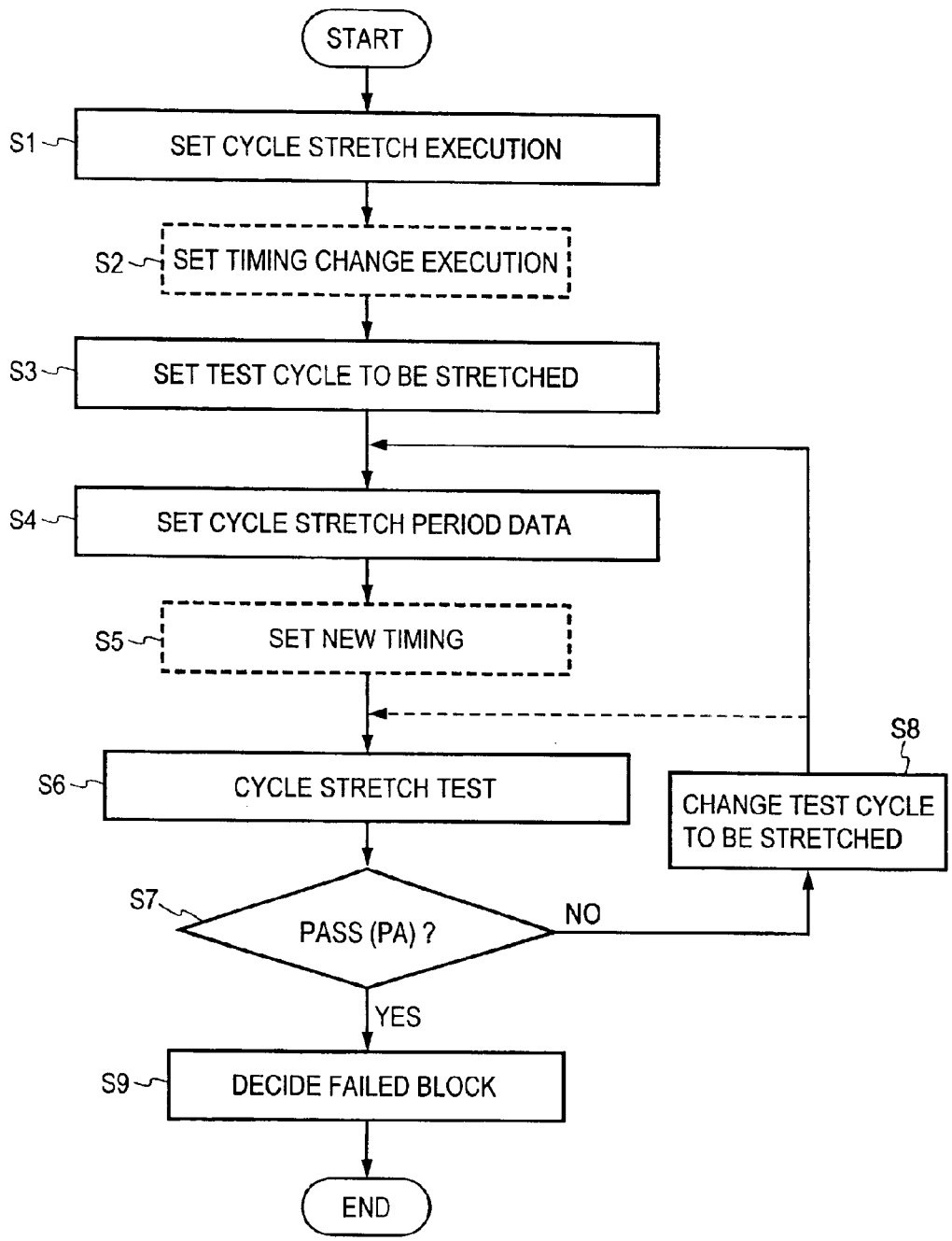
FIG. 13 is a flowchart showing the procedure of an embodiment of this invention method.

In the case where after step S8 the cycle stretch period data is set in the period data storage 41 in step S4 each time and the timing change is also made, the timing data is set in the timing setting register 61, but in the case where a period longer than any test cycle periods used in the high-speed test pattern concerned is set in the period data storage 41 to use fixed-value data as the period data for cycle stretch, when the timing data in the stretch cycle predetermined as required and set in the timing setting register 61 is used at all times, the procedure needs only to be made to return to step S6 after step S8 as indicated by the broken line in FIG. 13. Steps S1 and S2, and steps S4 and S5 may be reversed in order, respectively. In the case of returning from step S8 to S6, steps S1 to S4 may be performed in an arbitrary order.

Incidentally, the period data for stretch and the new timing data may be properly chosen by the user.

As described above, according to the present invention: the storage of the pattern generation memory 16 and the test cycle memory 34 need not be rewritten involving the translation of the pattern program into machine language; in an arbitrary test cycle the test can be carried out for its stretched period (time); the setting of the period can easily be changed; and the cycle stretch test can be conducted in a short time.

What is claimed is:

1. Semiconductor device test equipment which performs a test while stretching the period of a preset test cycle to a stretch cycle period, characterized by the provision of:

a pattern-generation memory provided with a test pattern storage part having stored therein a test pattern to be applied to a semiconductor device under test and an expected value pattern for comparison with the output from said semiconductor device under test and a control pattern storage part having stored therein a control pattern for controlling the period for application of said test pattern read out of said test pattern storage part;

a test cycle memory which stores a plurality of pieces of period data and from which one of said plurality of period data is read out in accordance with said control pattern;

a test cycle generator which is supplied with the period data read out of said test cycle memory and controls, in accordance with said period data, the period for application of said read-out test pattern;

a period data storage having stored therein period data on said stretch cycle period;

a stretch cycle detecting part which has set therein data representing the test cycle to be cycle-stretched and, when the read-out test cycle of said test pattern reaches the test cycle represented by said data set therein, detects it; and switching part which is controlled by the detection signal from said stretch cycle detecting part to switch long-period data stored in said period data storage to the period data read out of said test cycle memory for application to said test cycle generator.

2. The semiconductor device test equipment as claimed in claim 1, characterized in that said stretch cycle detecting part includes a cycle stretch setting part provided in said control pattern storage part, for setting a one-bit cycle stretch execution pattern which is read out together with the control pattern and represents the execution of cycle stretch, the cycle stretch execution pattern read out of said cycle stretch setting part being output as said cycle-stretch detected signal.

3. The semiconductor device test equipment as claimed in claim 1, characterized in that said stretch cycle detecting part includes: a pattern address setting part in which is set a pattern address corresponding to the test cycle to be cycle-stretched; and a coincidence detector which is supplied with the pattern address set in said pattern address setting part and a pattern address for reading out said pattern-generation memory and, upon coincidence between both of said addresses, detects and outputs it as said stretch-cycle detected signal.

4. The semiconductor device test equipment as claimed in claim 1, characterized in that said stretch cycle detecting part includes: a pattern counter for counting the number of test patterns which are read out o said test pattern storage part and applied to said semiconductor device under test; a cycle stretch setting part in which is set the number of times of pattern generation corresponding to the test cycle to be cycle-stretched; and a coincidence detector which is supplied with the number of times of pattern generation set in said cycle stretch setting part and the count value of said pattern counter and, upon coincidence between them, detects and outputs it as said stretch-cycle detected signal.

5. The semiconductor device test equipment as claimed in any one of claims 1 to 4, characterized by the provision of: a cycle stretch execution setting register in which is set cycle stretch test OK/NO data representing whether to conduct a cycle stretch test; and a validation/invalidation part which is supplied with the cycle stretch test OK/NO data set in said cycle stretch execution setting register and said stretch-cycle detected signal and, of said cycle stretch test OK/NO data is OK, outputs said stretch-cycle detected signal to said switching part.

6. The semiconductor device test equipment as claimed in any one of claims 1 to 4, characterized by the provision of:

a timing memory in which are stored plural sets of timing data defining the timing for the rise and fall of said test pattern to be applied to said device under test and the timing for comparing the response output from said device under test with said expected value pattern read out of said test pattern storage part and from which is read out one of said plural sets of timing data in accordance with a timing pattern in said read-out control pattern;

a timing setting register having set therein timing data which defines the timing for the rise of said test pattern to be applied to said device under test and/or the timing for comparing the response output from said device under test with said read-out expected value pattern;

a timing generator which is supplied with said one set of timing data read out of said timing memory and outputs a plurality of timing pulses corresponding to said data; and a second switch which is controlled by said stretch-cycle detected signal to switch the timing data from said timing memory to the timing data from said timing setting register for application to said timing generator.

7. The semiconductor device test equipment as claimed in any one of claims 1 to 4, characterized by the provision of:

a timing change OK/NO setting register in which is set timing change OK/NO data indicating whether to make a timing change; and a validation/invalidation part which is supplied with the timing change OK/NO data from said timing change OK/NO setting register and said stretch-cycle detected signal and, if said timing change OK/NO data is in the timing change OK state, supplies said stretch-cycle detected signal to said second switch.

8. A semiconductor device test method which performs a test while stretching the period of a preset test cycle to a stretch cycle period, characterized by the steps of:

reading out a control pattern and a test pattern from a pattern-generation memory for each test cycle;

reading out period data from a test cycle memory by a period pattern in said read-out control pattern;

generating a period signal of a duration corresponding to said out-out period data;

applying said read-out test pattern to a device under test during the duration of said period signal, comparing a response output signal from said device under test with an expected value in said read-out test pattern, and outputs a pass signal or fail signal depending on whether they coincides or not;

prestoring data on said stretch cycle period in a storage;

setting in a stretch cycle detecting part data corresponding to the test cycle for which said data on said stretch cycle period is to be used;

generating a detected signal by said stretch cycle detecting part when said data corresponding to the test cycle becomes the data corresponding to said preset test cycle; and responding to said detected signal to switch the period data from said test cycle memory to said data on said stretch cycle period stored in said period data storage for application to said test cycle generator.

9. The semiconductor device test equipment as claimed in claim 8, characterized in that:

a one-bit cycle stretch execution pattern is written, as said data to be set in said stretch cycle detecting part, in said pattern-generation memory at the address corresponding to the test cycle in which the test is to be conducted using said stretch cycle period; and when said cycle stretch execution pattern is read out from said pattern-generation memory, said read-out cycle stretch execution pattern is provided as said detected signal.

10. The semiconductor device test method as claimed in claim 8, characterized in that:

the address of said pattern-generation memory corresponding to the test cycle in which the test is to be conducted using said stretch cycle period is set in a pattern address setting part as said data to be set in said stretch cycle detecting part; and said detected signal is generated upon coincidence of an address read out of said pattern-generation memory with an address set in said pattern address setting register.

11. The semiconductor device test method as claimed in claim 8, characterized in that:

the number of times of pattern generation corresponding to the test cycle in which the test is to be conducted using said stretch cycle period is set in s stretch cycle setting part as said data to be set in said stretch cycle detecting part; and the number of times of pattern application to said device under test is counted and said detected signal is generated upon coincidence of the count value with the number of times of pattern generation set in said stretch cycle setting part.

12. The semiconductor device test method as claimed in any one claims 8 to 11, characterized in that when no cycle stretch test is conducted, cycle stretch non-execution data is set in a cycle stretch execution setting register and said detected signal is invalidated by said cycle stretch non-execution data.

13. The semiconductor device test method as claimed in any one of claims 8 to 11, characterized in that:

for each test cycle a timing memory is read out in accordance with a timing pattern in said read-out control pattern to obtain a set of timing data which defines the timing for the rise and fall of said test pattern to be applied to said device under test and the timing for comparing the response output from said device under test with said read-out expected value pattern;

said one set of timing data is provided to a timing generator to generate a plurality of corresponding timing pulses;

timing data which defines the timing for the rise of said test pattern to be applied to said device under test or/and the timing for comparing the response output from said device under test with said read-out expected value pattern is set in a timing setting register; and timing data from said timing memory is switched by said detected signal to the timing data in said timing setting register for application to said timing pulse generator.

* * * * *